(12) United States Patent
Schoenborn et al.

(10) Patent No.: US 7,206,981 B2
(45) Date of Patent: Apr. 17, 2007

(54) COMPLIANCE TESTING THROUGH TEST EQUIPMENT

(75) Inventors: Theodore Z. Schoenborn, Portland, OR (US); Andrew W. Martwick, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 471 days.

(21) Appl. No.: 10/334,737

(22) Filed: Dec. 31, 2002

(65) Prior Publication Data

US 2004/0128595 A1    Jul. 1, 2004

(51) Int. Cl.
*G01R 31/28* (2006.01)
*H03K 17/16* (2006.01)

(52) U.S. Cl. .............................. 714/724; 326/30

(58) Field of Classification Search .................. 714/714, 714/742, 727, 731, 733, 738, 724; 326/30, 326/86
See application file for complete search history.

(56) References Cited

U.S. PATENT DOCUMENTS

| | | | | |
|---|---|---|---|---|
| 5,374,861 | A | * | 12/1994 | Kubista ........................ 326/30 |
| 5,418,475 | A | | 5/1995 | Otaka |
| 5,821,798 | A | | 10/1998 | Tonn, Jr. |
| 6,130,795 | A | | 10/2000 | Freitas et al. |
| 6,177,807 | B1 | | 1/2001 | Bertin et al. |
| 6,192,496 | B1 | * | 2/2001 | Lawrence et al. .......... 714/724 |
| 6,222,388 | B1 | | 4/2001 | Bridgewater, Jr. |
| 6,424,169 | B1 | | 7/2002 | Partow et al. |
| 6,631,962 | B2 | * | 10/2003 | Rehmann et al. ............... 347/5 |
| 6,677,778 | B2 | | 1/2004 | Lindsay et al. |
| 6,744,275 | B2 | | 6/2004 | Chansungsan |
| 6,781,405 | B2 | | 8/2004 | Rajan et al. |
| 6,816,987 | B1 | | 11/2004 | Olson et al. |
| 6,865,222 | B1 | * | 3/2005 | Payne ........................ 375/224 |
| 6,904,554 | B2 | | 6/2005 | Block et al. |
| 6,910,155 | B2 | | 6/2005 | Ku |

OTHER PUBLICATIONS

Universal Serial Bus Specification, Revision 2.0, Apr. 2000, pp. cover, v-xiv, 20, 123-129, 142-157, 169-178, 239, 244-245, 275-278, 287-299, 309-316, and 332-335 Found at: www.usb.org/developers/docs/.
PCI Express Base Specification Rvision 1.0, Jul. 22, 2002, cover page and pp. 4 and pp. 155-220.

* cited by examiner

*Primary Examiner*—James C Kerveros
(74) *Attorney, Agent, or Firm*—Blakely, Sokoloff, Taylor & Zafman LLP

(57) ABSTRACT

In some embodiments, a chip comprising transmitters, local receivers, and control circuitry to determine whether the transmitters are coupled to remote receivers through interconnects. If certain conditions are met the control circuitry causes the transmitters to transmit a compliance test pattern on the interconnects. The conditions include that the control circuitry determines that the remote receivers are coupled to the transmitters and the local receivers have not received signals within a particular time. Other embodiments are described and claimed.

21 Claims, 9 Drawing Sheets

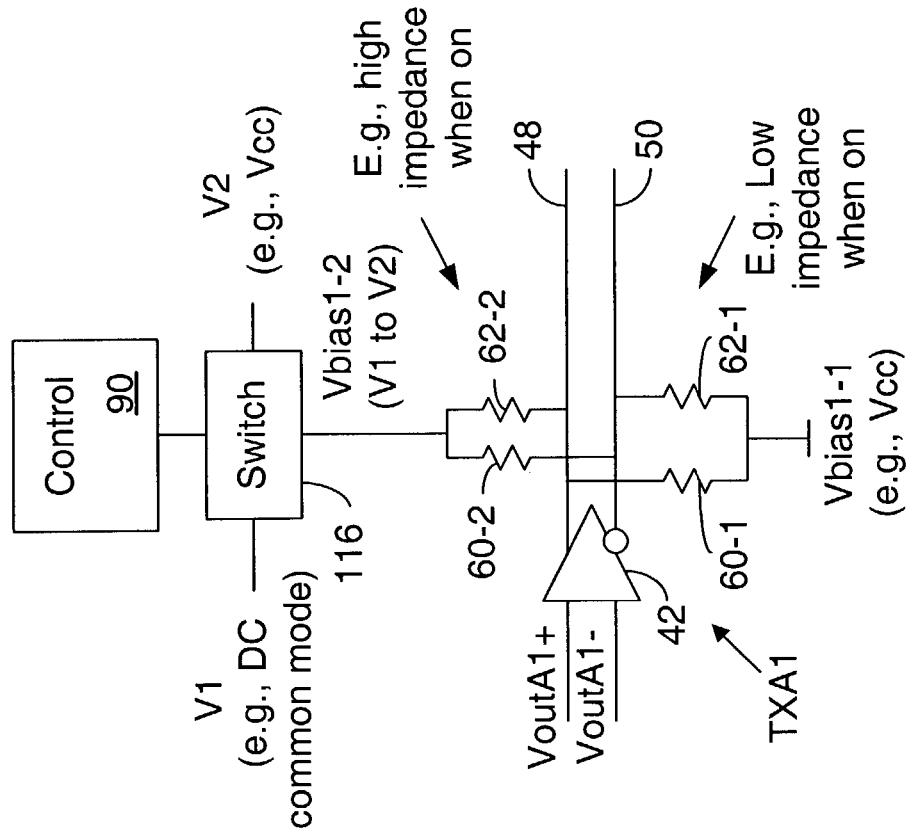
FIG. 6
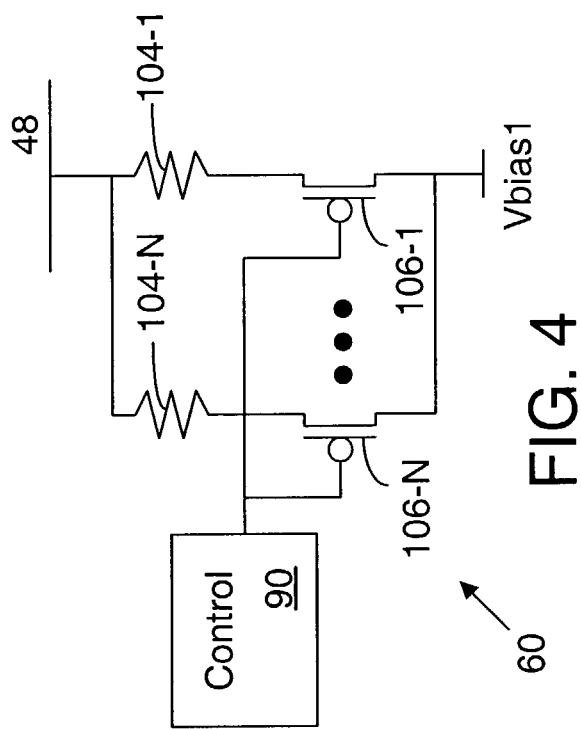
FIG. 4
FIG. 5

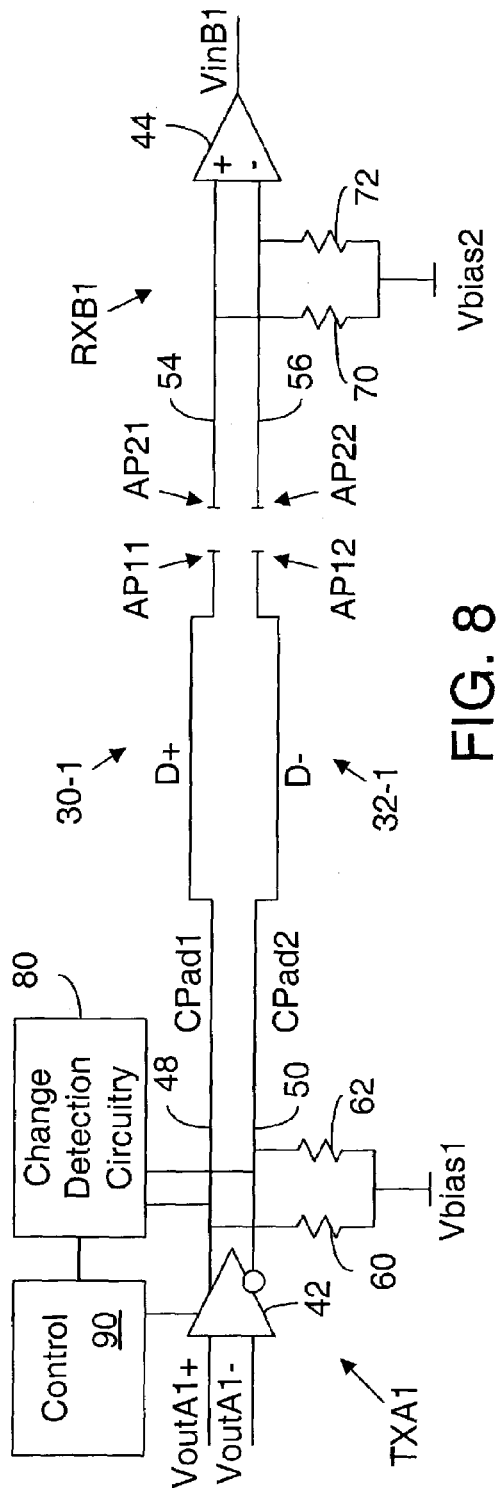
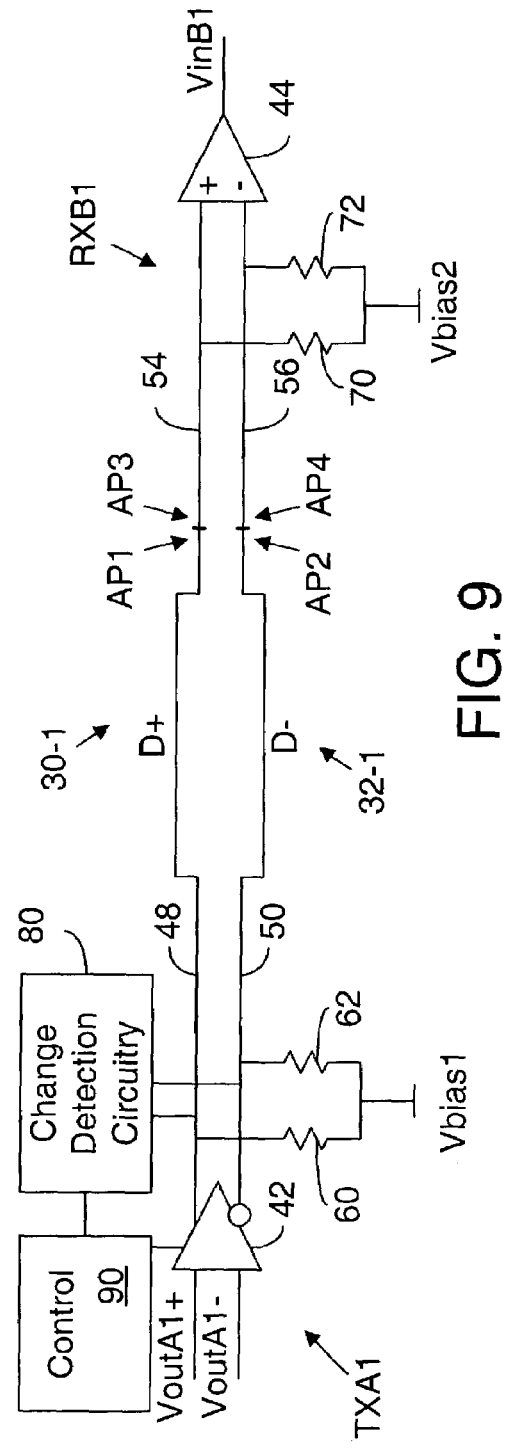
FIG. 8
FIG. 9

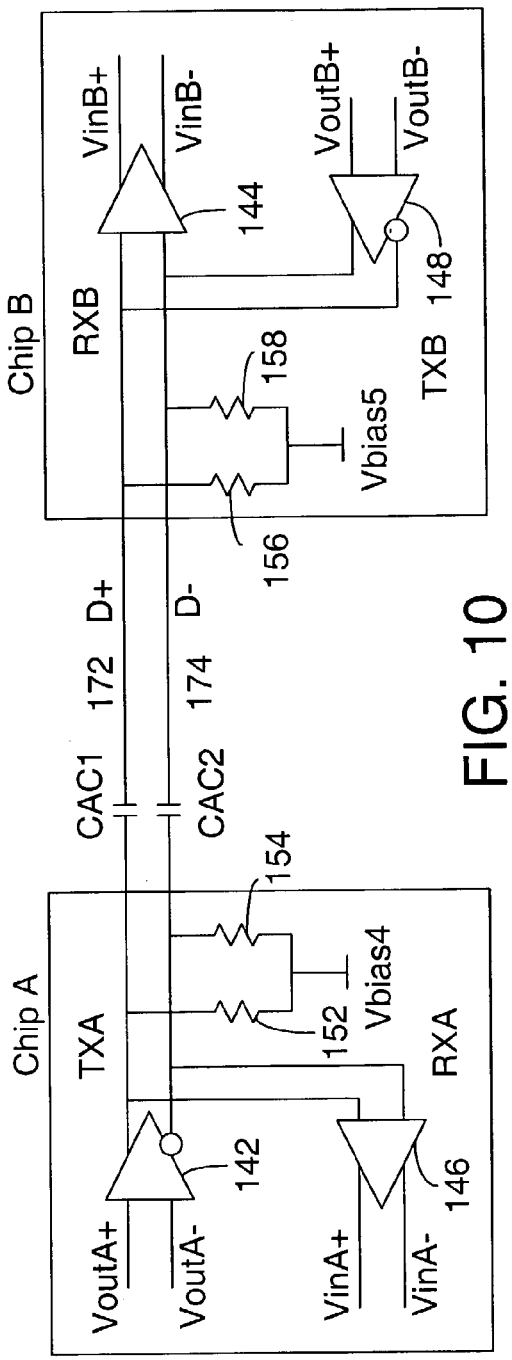
FIG. 10
FIG. 11
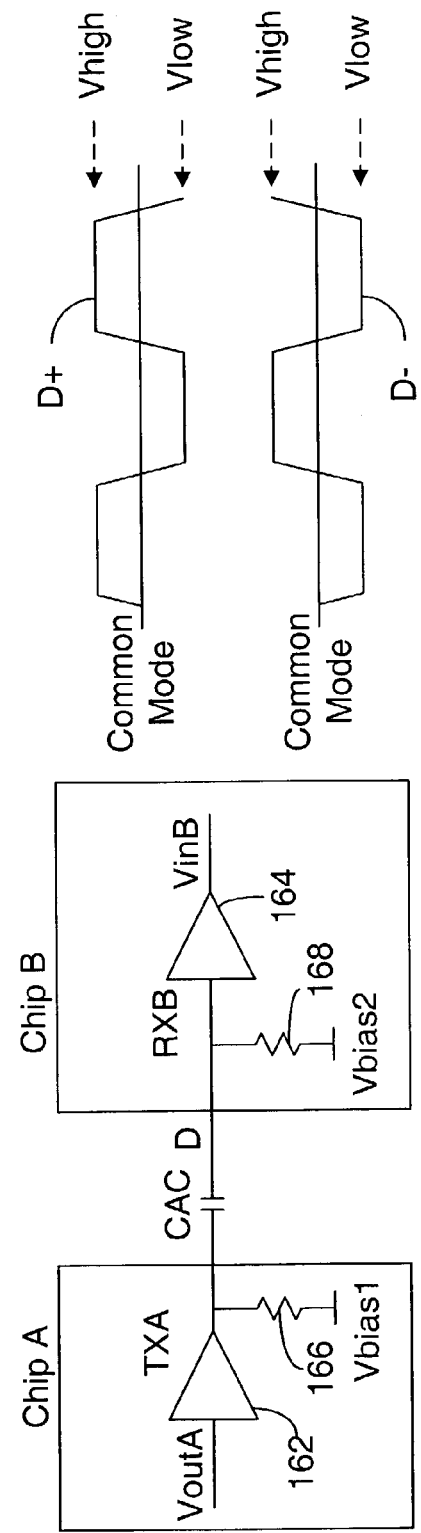
FIG. 12

US 7,206,981 B2

COMPLIANCE TESTING THROUGH TEST EQUIPMENT

RELATED APPLICATION

The present application and application Ser. No. 10/334,735, now U.S. Pat. No. 6,906,549, entitled "Asynchronous Coupling and Decoupling of Chips" were filed on the same day and have overlapping specifications. Application Ser. No. 11/152,268, pending, is a continuation of application Ser. No. 10/334,735. The present application and application Ser. No. 10/334,751, now U.S. Pat. No. 6,825,693, entitled "Remote Receiver Detection" were filed on the same day and overlapping specifications. Application Ser No. 10/999,590, pending, is a continuation of application Ser. No. 10/334,751.

BACKGROUND

1. Technical Field

The present inventions relate to techniques for a chip to provide a compliance test pattern to test equipment.

2. Background Art

Various techniques have been developed for chips to communicate with each other. The techniques include those that have been standardized and those that have not been standardized. An example of standardized techniques include versions of the Peripheral Chip Interconnect (PCI) Local Bus Specification, such as a PCI Local Bus Specification rev. 2.2, dated Dec. 18, 1998, by the PCI Special Interest Group (SIG). A PCI Express specification, formerly known as 3GIO ($3^{rd}$ generation input output), is in the process of being defined by the PCI SIG. A PCI Express Base Specification Revision 1.0, Jul. 22, 2002, has been released and is available with the payment of a fee.

Techniques are used to indicate to a first chip that a second chip is coupled to it. For example, presence detect methods involving generating a side band presence detect signal and providing it to the first chip to indicate the second chip is coupled to the first. The presence detect signal can be generated when a card including the second chip is inserted in a slot such that the second chip is coupled to the first chip. A drawback in the presence detect method is that it is not very scalable or versatile.

Another technique to indicate that the second chip is coupled to the first is for the first chip to periodically attempt to train the second chip. If the second chip responds to the training sequence, the first chip learns that it is coupled to the second chip. A drawback with this approach is it takes a relatively large amount of power to regularly try to train a chip that is not present.

Signals are often applied differentially on two conductors (interconnects). The term "common mode" refers to the average voltage on the conductors. A potential danger in connecting one chip with another occurs when the common mode of one chip is significantly higher than that of another. In that case, when the chips are coupled, the gate oxide of the transistors of the receivers might be destroyed through excessive voltage.

Systems have used capacitors in series with conductors to pass the difference between signals on the two conductors, but not the common mode under ordinary operation. However, during a hot plug insertion of a chip, the chips may be exposed to the others common mode, potentially leading to destroying of transistor gate oxide.

BRIEF DESCRIPTION OF THE DRAWINGS

The inventions will be understood more fully from the detailed description given below and from the accompanying drawings of embodiments of the inventions which, however, should not be taken to limit the inventions to the specific embodiments described, but are for explanation and understanding only.

FIG. 4 is a schematic block diagram representation of details included in some embodiments of FIGS. 2 and 3.

FIG. 5 is a schematic block diagram representation of details included in some embodiments of FIGS. 2 and 3.

FIG. 6 is a schematic block diagram representation of details included in some embodiments of FIGS. 2 and 3.

FIG. 8 is a schematic block diagram representation of a system according to some embodiments of the inventions while chip B is not coupled to chip A.

FIG. 9 is a schematic block diagram representation of a system according to some embodiments of the inventions while chip B is coupled to chip A.

FIG. 10 is a schematic block diagram representation of a system using a bi-directional signaling according to some embodiments of the inventions.

FIG. 11 is a schematic block diagram representation of a system using single ended signaling according to some embodiments of the inventions.

FIG. 12 is a timing diagram illustrating data signals D+ and D− that may be used in some embodiments of the inventions.

DETAILED DESCRIPTION

Figure 1:
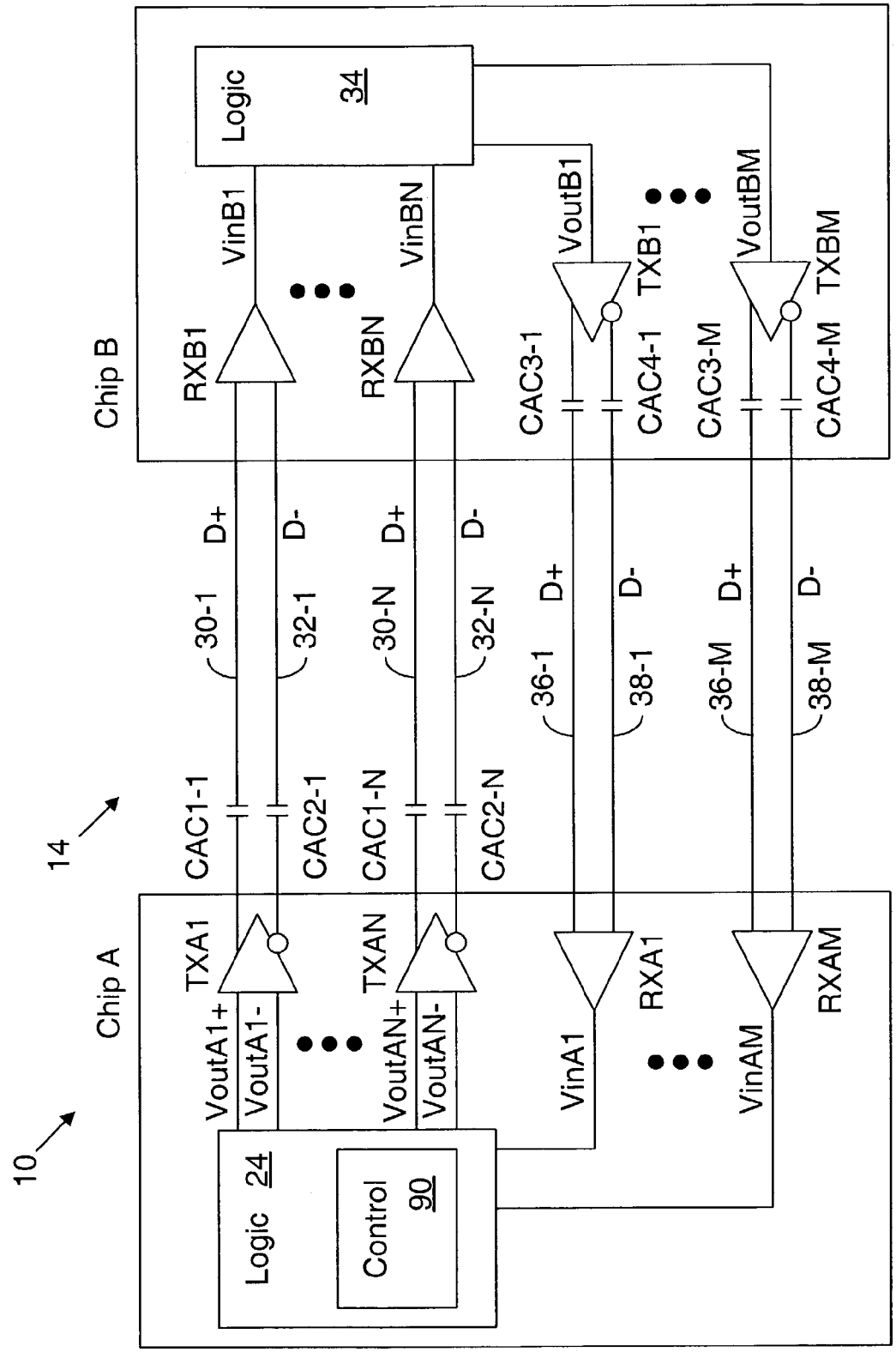
FIG. 1 is a schematic block diagram representation of a system including chips according to some embodiments of the inventions.

FIG. 1 illustrates a system 10 having a first chip (chip A) and a second chip (chip B) coupled through a link 14. Transmitters TXA1 . . . TXAN of chip A are coupled to remote receivers RXB1 . . . RXBN of chip B through interconnects 30-1, 32-1 . . . 30-N, 32-N of link 14. Likewise, remote transmitters TXB1 . . . TXAM of chip B are coupled to local receivers RXA1 . . . RXAM of chip A through interconnects 36-1, 38-1 . . . 36-M, 38-M of link 14. N may be the same number as or a different number than M. In this description, the terms local and remote are from the perspective of transmitters TXA1 . . . TXAN of chip A.

In an ordinary data transmitting state, logic 24 provides VoutA1+, VoutA1− . . . VoutAN+, VoutAN− signals to transmitters TXA1 . . . TXAN which transmit these as differential signals D+ and D− on interconnects 30-1, 32-1 . . . 30-N, 32-N. Receivers RXB1 . . . RXBN convert the differential signals back to single ended signals VinB1 . . . VinBN for logic 34, although they could be kept as differential signals. Receivers RXB1 . . . RXBN may invert the received signal or not invert it.

Chips A and B may be chips on a card(s), motherboard(s), or other substrate(s). The interconnects include one or more of the following: slots, fingers, traces, and other conductive materials that may be present between the chips. There may be more than one chip on a card, motherboard, or other substrate. Multiple chips may be coupled to one or more than one chip.

FIG. 1 illustrates decoupling capacitors CAC1-1 and CAC2-1, CAC1-N and CAC2-N, CAC3-1 and CAC4-1, CAC3-M and CAC4-M in series in interconnects 30-1 and 32-1, 30-N and 32-N, 36-1 and 38-1, and 36-M and 38-M, respectively. The decoupling capacitors block direct current (DC) voltage but pass higher frequency signals. Decoupling capacitors CAC-1, CAC2-1, CAC1-N, and CAC2-N are illustrated as being on the interconnect externally from the chip, whilst decoupling capacitors CAC3-1, CAC4-1, CAC3-M, and CAC4-M are illustrated as being in the chip. However, each of the decoupling capacitors could be external. Depending on the capacitance of the decoupling capacitors, it may be impractical to have a decoupling capacitor on die. For example, the decoupling capacitors may be about 75 nanofarads, although they may be more or less than that. The decoupling capacitors may be in the chip package, on a card supporting the chip, on the motherboard or elsewhere. The label 30-1 is intended to be the label for the interconnect on each side of decoupling capacitor CAC1-1. Some embodiments do not include decoupling capacitors (see, for example, FIGS. 8 and 9, discussed below).

In the ordinary data transmitting state, the AC swing of data signals D+ and D− passes through the decoupling capacitors, but the common mode does not. Accordingly, the signals on either side of the decoupling capacitors may be called D+ and D−, but the DC offset of these signals may be different.

The inventions are not restricted to a particular type of signaling. In some embodiments, the signaling may be of the type in which the clock is recovered from the data signals D+ and D− and used to provide a sampling clock in phase with the data. However, other types of signaling may be used. The data signals D+ and D− may represent traditional data as well as command signals, although that is not required. For example, commands may be provided through different interconnects than the data. The command and traditional data may be packetized or time multiplexed, although that is not required. The signaling may be unidirectional or sequential or simultaneous bi-directional (see, for example, FIG. 10, discussed below).

In some embodiments, the link includes lanes, where a lane is formed of interconnects between two opposite pairs of transmitters and receivers. For example, a lane might include interconnects 30-1, 32-1, 36-1, and 38-1, where interconnects 30-1 and 32-1 carry signals from chip A to chip B and interconnects 36-1 and 38-1 carry signals from chip B to chip A. However, the use of such lanes is not required.

The inventions may be implemented in systems that are compliant with a PCI Express specification and also in systems that are not PCI Express compliant.

A. Detection of Whether a Transmitter is Coupled to a Receiver

In some embodiments, the inventions involve techniques for detecting whether chips A and B are coupled through the interconnects. More precisely, the techniques involve inferring whether a receiver is coupled to a transmitter through analyzing a voltage change on a node or nodes and determining whether the voltage change is consistent with a remote receiving being coupled through the interconnects to the transmitter.

Two chips are functionally coupled if (1) they are physically coupled through the interconnect and (2) both chips have power. There are two ways in which one chip (e.g., chip B) can be functionally coupled to or decoupled from another chip (e.g., chip A). First, a powered chip B can be physically coupled to or decoupled from chip A through attachments points and interconnects. Second, an unpowered chip that is physically coupled to the other chip can become powered, or a powered chip can become unpowered. Some chips detect a physically coupled remote receiver only if the receiver is also functionally coupled. Other chips detect a physically coupled remote receivers even if it does not have power.

Figure 2:
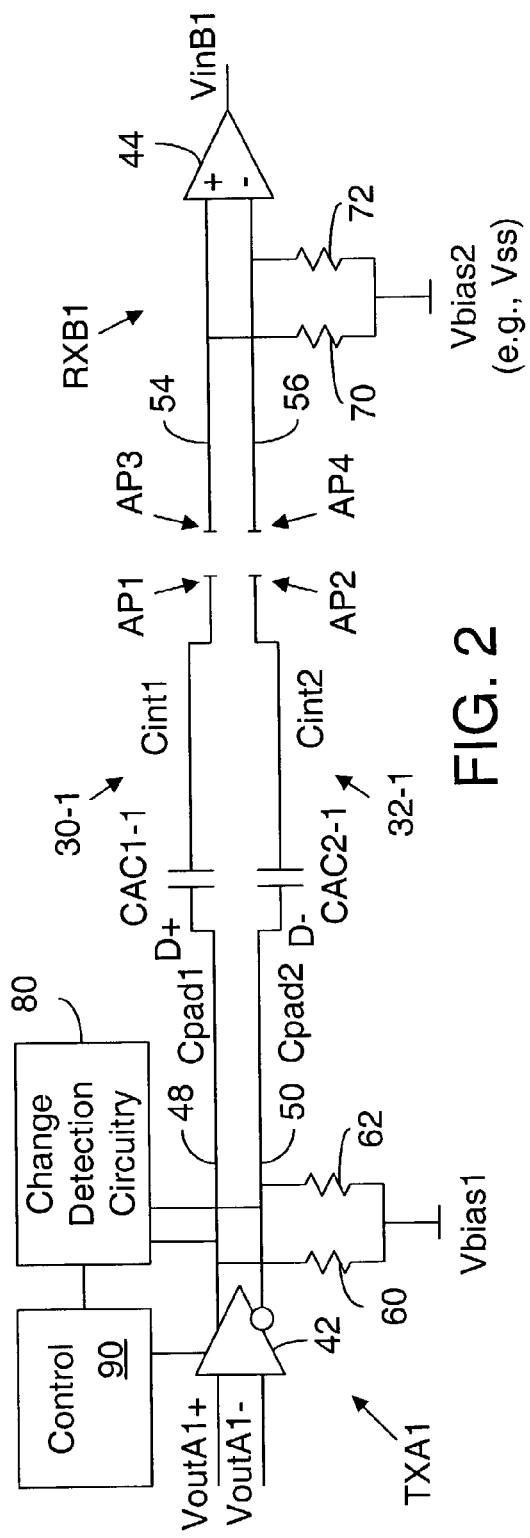
FIG. 2 is a schematic block diagram representation of details of FIG. 1 according to some embodiments of the inventions while chip B is not coupled to chip A.
Figure 3:
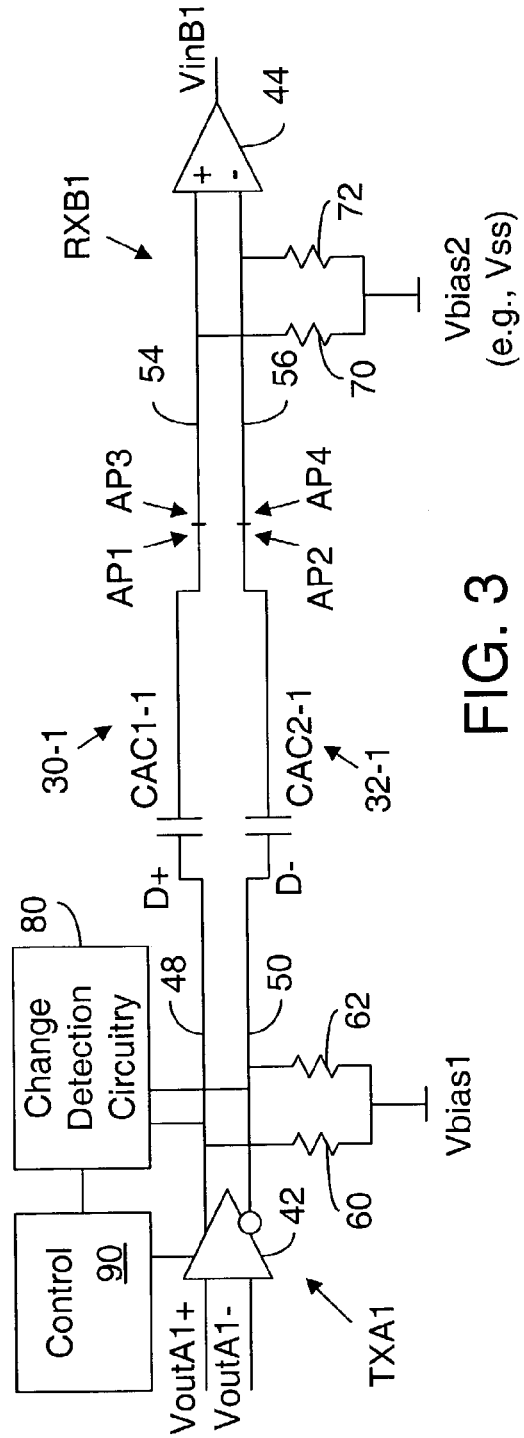
FIG. 3 is a schematic block diagram representation of details of FIG. 1 according to some embodiments of the inventions while chip B is coupled to chip A.

FIG. 2 illustrates chips A and B not being coupled and FIG. 3 illustrates chips A and B being coupled through interconnects 30-1 and 32-1. A variable voltage source Vbias1 is changed from a first voltage V1 to a second voltage V2 and change detection circuitry 80 detects changes in the voltages of output node 48 (V48) and/or node 50 (V50). In the following discussion, it is assumed that change detection circuitry 80 is monitoring both node 48 and node 50, but it could monitor only node 48 or only node 50. Transmitter TXA1 includes driver 42 and resistive structures 60 and 62. In the ordinary data transmission state, in response to input signals VoutA1+ and VoutA1−, driver 42 provides differential signals D+ and D− on nodes 48 and 50 and interconnects 30-1 and 32-1. In some embodiments, driver 42 includes a current source and two switches controlled by VoutA1+ and VoutA1−. The two switches are coupled between the current source and nodes 48 and 50. However, the inventions are not limited to these details. In some embodiments, in a remote receiver detection state, driver 42 turns off (both switches off) and D+ and D− are pulled to the same value (called an electrical idle state) through resistive structures 60 and 62. As explained below, in some embodiments, during ordinary data transmission state, resistive structures 60 and 62 have low impedances (and match the impedances of the interconnects), and during the remote receiver detection state, resistive structures 60 and 62 have high impedances. In embodiments in which Vbias is greater than ground, driver 42 may terminate to ground. In embodiments in which Vbias is at ground, driver 42 may terminate at higher than ground.

There are various techniques by which change detection circuitry 80 and control circuitry 90 may determine whether the change in V48 and V50 are consistent with the transmitter being coupled to a remote receiver through interconnects. Under one technique, change detection circuitry 80 measures how long it takes after Vbias changes voltage for both V48 and V50 to reach a threshold voltage and compares that length of time with a threshold length of time. The threshold voltage may be V2 or less than V2. Control circuitry 90 concludes from the comparison whether a remote receiver is coupled to the transmitter. For example, if the measured length of time is less than (or less than or equal to depending on the implementation) the threshold length of time, the conclusion would be that the remote receiver is not coupled. If the measured length of time is greater than (or greater than or equal to depending on the implementation) the threshold length of time, the conclusion would be that the remote receiver is coupled.

Under another technique, change detection circuitry 80 measures V48 and V50 at a particular length of time after Vbias changes voltage and compares the measured V48 and V50 with a threshold voltage. The threshold voltages in the two techniques may be the same or different. The threshold voltage may be V2 or less than V2. Control circuitry 90 concludes from the comparison whether a remote receiver is coupled to the transmitter. For example, if the measured voltages are each less than (or less than or equal to depending on the implementation) the threshold voltage, the conclusion would be that the remote receiver is coupled. If the measured voltages are each greater than or (greater than or equal to depending on the implementation) the threshold voltage, the conclusion would be that the remote receiver is not coupled. Still other techniques could be used.

In the example of FIG. 2, control circuitry 90 is operating in a state that assumes receiver RXB1 is not coupled to TXA1. To determine whether a remote receiver (RXB1) has become coupled to TXA1, control circuitry 90 causes Vbias1 to change from a first voltage V1 to a second voltage V2. V1 may be more or less than V2. Merely as an example, voltage V1 is 1.0 volts and voltage V2 is 1.5 volts, although various other voltages could be used for V1 and V2. In the example, prior to the change, Vbias1 has been 1.0 volts and nodes 48 and 50 are at 1.0 volts or essentially 1.0 volts. When Vbias1 changes to 1.5 volts, nodes 48 and 50 change to 1.5 almost instantaneously. The small amount of pad capacitance Cpad1 and Cpad1 is negligible for all practical purposes. There is also some capacitance in decoupling capacitors CAC1-1 and CAC2-1, but since they are not coupled on the other end, they are not significant. The voltages V48 and V50 will rapidly reach the threshold voltage such that control circuitry 90 will conclude the remote receiver is not coupled to TXA1.

Referring to FIG. 3, chips A and B are coupled such that attachment points AP1 meets AP3 and attachment point AP2 meets attachment point AP4. (There may also be attachment points, which are not shown, between chip A and the interconnects.) Initially, control circuitry 90 is in a state that assumes the remote receiver is not coupled to TXA1. To determine whether RXB1 has become coupled to TXA1, control circuitry 90 causes Vbias1 to change from V1 to V2. In the example, before the change, nodes 48 and 50 are at V1 or essentially at V1. When Vbias1 changes to V2, nodes 48 and 50 essentially instantaneously change to intermediate voltage values which may be called the instantaneous voltage Vinst48 and Vinst50, respectively, and then change exponentially from Vinst48 and Vinst50 to V2 as a function of resistance and capacitance. The decoupling capacitors CAC1-1 and CAC2-1 provide most of the capacitance.

For practical purposes, Vinst48=Vchange R70/(R60+R70), where Vchange=V2−V1, and R60 and R70 are the resistance of resistive structures 60 and 70. For practical purposes, Vinst50=Vchange R71/(R62+R72), where R62 and R72 are the resistance of resistive structures 62 and 72. If R60=R70 (and R62=R72), then Vinst48 and Vinst50 are each (V2−V1)/2. If R60>R70 and R62>R72, then Vinst48 and Vinst50 are each <(V2−V1)/2, and if R60<R70 and R62<R72, then Vinst48 and Vinst50 are each >(V2−V1)/2. For reasons explained below, it is desirable for R60 and R62 to each be much greater than R70 and R72. Under either technique described above, the result of the comparison by change detection circuitry 80 is such that control circuitry 90 concludes the remote receiver (RXA1) is coupled to transmitter TXA1.

Once it is determined that a remote receiver is coupled through the interconnects, TXA1 can proceed to communicate with the remote receiver through additional actions (e.g., training and configuration). At some point, TAX1 changes to the ordinary data transmitting state in which resistive structures have low impedance and driver 42 is on providing differential D+ and D−.

Transmitters in chip B may also check to see if they are coupled to receivers. Transmitters of chip B may be like those of chip A and the receivers of chip A may be like those of chip B.

Resistive structures 60, 62, 70, and 72 may have constant resistance or variable resistance. Some of resistive structures 60, 62, 70, and 72 may have constant resistance and others of resistive structures 60, 62, 70, and 72 may have variable resistance. FIG. 4 illustrates an implementation in which resistive structure 60 has variable resistance. In the example of FIG. 4, resistive structure 60 includes a passive resistive elements 104-1 . . . 104-N and active resistive elements p-type field effect transistor (PFETs) 106-1 . . . 106-N, where N may be the same or different than N in FIG. 1. The PFETs may be metal oxide semiconductor PFETs (PMOSFETs) or some other type of FET. PFETs 106-1 . . . 106-N are turned on or off through control circuitry 90. When all the PFETS 106-1 . . . 106-N are on, the resistance is less than when only one is on. The desired resistance may be achieved through selecting a particular number of transistors. Node 48 is decoupled from Vbias1 when all the PFETS are off. When all the PFETs are off, the impedance of resistive element 60 is extremely high (e.g., several hundred thousands ohms.) In other embodiments, there may be only one passive resistive element (e.g., element 104-1 in series with the parallel PFETs 106-1 . . . 106-N). An example of a constant resistance resistive structure is merely a passive resistive element.

An advantage of having resistive structures 70 and 72 be variable resistance structures like those of FIG. 4 is that when no power is applied, they have a very high impedance (e.g., several hundred thousand ohms). In this way, when no power is applied to chip B, even if it is coupled to chip B, control circuitry 90 will not detect its presence. Resistive structures 70 and 72 may terminate energy on the interconnects.

Referring to FIG. 1, each transmitter (TXA1 . . . TXAN) can separately determine whether it is coupled to a remote receiver through interconnects. Alternatively, the decision can be made for all transmitters or a subset of them if control circuitry 90 concludes one or more remote receivers are coupled. Transmitters may share a variable voltage source Vbias1. There may be more than one variable voltage source in the chip.

FIG. 5 illustrates a way in which Vbias1 can change from V1 to V2 in FIGS. 2 and 3. Voltages V1 and V2 are supplied to a switch 116 which passes either V1 or V2 to Vbias1 under the control of control circuitry 90.

FIG. 6 illustrates resistive structures 60 and 62 and variable voltage source Vbias1 according to some embodiments of the system of FIGS. 2 and 3. The inventions do not require the details of FIG. 6. Variable voltage source Vbias1 is split between sub-voltage sources Vbias1-1 and Vbias1-2.

Resistive structure 60 is split between sub-resistive structures 60-1 and 60-2 and resistive structure 62 is split between sub-resistive structures 62-1 and 62-2. Vbias1-2 is provided by switch 116. In some embodiments, in the ordinary data transmitting state, sub-resistive structures 60-1 and 62-1 are on such that the voltage of sub-voltage source Vbias1-1 is passed to nodes 48 and 50. In the remote receiver detection state, sub-resistive structures 60-1 and 62-1 are off thereby effectively decoupling nodes 48 and 50 from Vbias1-1, and sub-resistive structures 60-2 and 62-2 are on such that the voltage of Vbias1-2 is passed to nodes 48 and 50. Resistive structures 60-2 and 62-2 may be turned off in the ordinary data transmitting state or by left on during that state. In some embodiments, the voltage of Vbias1-1 is Vcc, V1 is the DC common mode and V2 is Vcc.

In some embodiments, during the ordinary data transmitting state, resistive structures 60 and 62 have low impedance, and during the remote receiver detection state, resistive structures 60 and 62 have high impedance. One way for this to be accomplished is during the ordinary data transmitting state, for resistive structures 60-1 and 62-1 to have low impedance, and during the remote receiver detection state, for resistive structures 60-2 and 62-2 to have high impedance. Resistive structures 60-2 and 62-2 may stay having high impedance or turn off during the ordinary data transmitting state. If the state resistive structures are used for both low and high impedance, the impedance can be adjusted as described in connection with FIG. 4. Resistive structures 60-1, 62-1, 60-2, and 62-2 may each have only one impedance level while they are on or control circuitry 90 may have the ability to place them each in different impedances.

Figure 7:
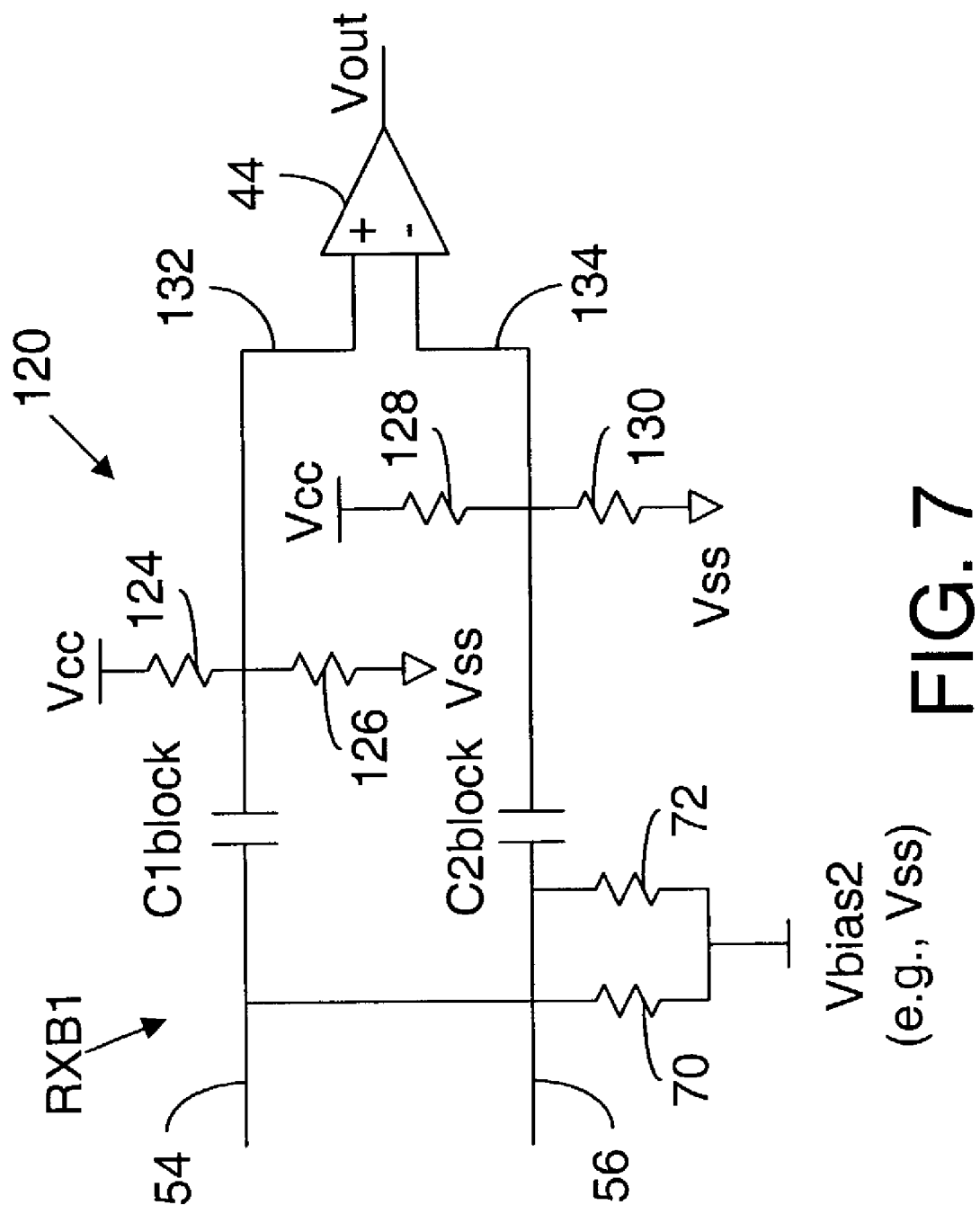
FIG. 7 is a schematic block diagram representation of a receiver including a receiving bias network included in some embodiments of the inventions.

Referring to FIGS. 2 and 3, RXB1 includes receiving circuitry 44 and resistive structures 70 and 72. In some embodiments, Vbias2 is a ground voltage node. However, generally, Vbias1 may be higher than, equal to, or lower than Vbias2. In some embodiments, Vbias2 is at ground, but receiving circuitry 44 is at another common mode. Referring to FIG. 7, this can be accomplished through a receiver bias network 120 that is coupled between nodes 54 and 56 (see FIGS. 2 and 3) and receiving circuitry 44. Network 120 includes blocking capacitors C1block and C2block to block DC voltages between nodes 54 and 56 and nodes 132 and 134, respectively. Bias resistors 124 and 126 act as voltage dividers between power (Vcc) and ground (Vss) for node 132 and bias resistors 128 and 130 act as voltage dividers between power (Vcc) and ground (Vss) for node 134. Resistors 124 and 126 may have equal resistances leading node 132 to be Vcc/2 or they may be different to provide another voltage for node 132. The same is true with node 134. Resistors 124, 126, 128, and 130 may be active and/or passive components. Node 132 is at the positive input and node 134 is at the negative input of differential receiver circuitry 44. Of course, which is connected to the positive input and which is connected to the negative input can be switched leading to an inverted signal. In some embodiments, C1block and C2block have much greater capacitances than gate-to-source capacitances in the input transistors of receiver circuitry 44.

The common mode is |D++D−|/2. For example on the receiver, if D+ is 400 millivolts (mV) and D− is −400 mV, the common mode is zero volts. As another example, if D+ is 1000 mV and D− is −200 mV, the common mode is 600 mV. In both examples, the differential swing is 800 mV. See FIG. 12. In electrical idle, D+=D− so that the common mode equals D+=D−.

In PCI Express terminology, the system is in a detect.quiet state when control 90 understands a receiver is not coupled to TXA1 through an interconnect. During the detect.quiet state, TXA1 holds a particular common mode for a specified amount of time. TXA1 may be in a high impedance electrical idle state in which D+=D−. In PCI Express, if the transmitter was not in an high impedance state, upon entry it transition to the high impedance state immediately without sending the electrical idle ordered set. A detect.active state is entered after a particular time in the detect.quiet state (e.g., 12 milliseconds (ms)) or when the operating DC common mode voltage is stable and within specification. In detect.active, a receiver detect process is performed as discussed above. If a receiver is not detected, the system returns to the detect.quiet state. If a receiver is detected, the system enters a detect.charge state in which the transmitter is in a high impedance electrical idle state and charges nodes 48 and 50 to the operating common mode. The next state is polling after a 12 ms timeout or when the operating DC common mode voltage is stable and within specifications. As noted, the inventions do not have to be implemented in according to the PCI Express standard.

In some embodiments, decoupling capacitors are not included in the interconnects. For example, FIGS. 8 and 9 include systems very similar to those of FIGS. 2 and 3, except that in FIGS. 8 and 9, the interconnects 30-1 and 32-1 do not include decoupling capacitors. Since the decoupling capacitors slowed the exponential rise, V48 and V50 may reach the threshold voltage quicker in the case of FIG. 9 than in the case of FIG. 3.

FIGS. 2, 3, 8, and 9 illustrate unidirectional signaling. By contrast, FIG. 10 illustrates a system including bi-directional signaling. Referring to FIG. 10, chip A includes transmitter TXA and receiver RXA that share interconnects 172 and 174 with transmitter TXB and receiver RXB of chip B. Transmitter TXA includes resistive structures 152 and 154 and driver 142. Receiver RXA includes resistive structures 152 and 154 and receiving circuitry 146. Transmitter TXB includes resistive structures 156 and 158 and driver 148. Receiver RXB includes resistive structures 156 and 158 and receiving circuitry 144. When transmitter TXA is detecting whether RXB is coupled, voltage Vbias4 may change. When transmitter TXB is detecting whether RXA is coupled, voltage Vbias5 may change. The system may perform sequential (time multiplexed) or simultaneous (e.g., multi-voltage level) bi-directional signaling. Chips A and B may include additional transmitters and receivers.

FIGS. 2, 3, 8, 9, and 10 have included differential interconnect signaling. However, as illustrated in FIG. 11, single ended interconnect signaling may be used. For example, in FIG. 11, chip a includes a transmitter TXA having a single ended driver 162 and a resistive structure 166. TXA can detect whether receiver RXB is coupled by changing the voltage of Vbias1. RXB includes receiving circuitry 164 and resistive structure 168 coupled to voltage Vbias2 (e.g., ground).

The various embodiments may mix and match the different features illustrated in the figures. For example, bi-directional signaling of FIG. 10, may be single ended as in FIG. 11 and/or not include decoupling capacitors as in FIGS. 8 and 9.

B. Asynchronous Coupling and Decoupling of Chips

This section discusses techniques for asynchronous coupling and decoupling chips. In this context "asynchronous" means that one chip (e.g., chip B) may be coupled to another chip (e.g., chip A) or decoupled from the other chip without the other chip having foreknowledge of the coupling or decoupling. This may be called surprise coupling and decoupling or hot plugging. The coupling and decoupling may be physical or functional. Physical coupling may be called insertion and physical decoupling may be called removal.

1. Decoupling

Consider a transition from FIG. 3 to FIG. 2. Assume that following a time when chips A and B are actively communicating with each other that attachment points AP1 ... AP4 are physically separated. There are various ways in which the knowledge of the decoupling can occur. One way is that control circuitry 90 of logic 24 will notice that the inputs of the local receivers of chip A have sensed an unexpected electrical idle for a particular amount of time (input signal D+=input signal D−). Note that there may be an expected electrical idle during a low power state. Another way is for transmitter TXA1 to periodically perform a detection procedure as is described above. The periodic detection may be particularly useful during a low power state. (Note that in this context, periodically means regularly, but not necessarily equally spaced.) Still another way is through some side band signal (such as a presence detect signal), although as discussed above, some embodiments of the invention do not utilize side band presence detect signals. If chips A and B are decoupled before chip A realizes chip B is physical coupled (for example, because they are not functionally coupled), then in some embodiments, nothing changes because of the decoupling.

Surprise decoupling can occur in at least two possible physical layer states:

(1) When the link is active (the ordinary data transmitter state) at the time of surprise removal, control circuitry 90 may understand that a surprise removal has happened by one or more local receivers sensing an unexpected electrical idle. In some embodiments, all normal electrical idle conditions are initiated by ordered sets, although this is not required. A proposed maximum time limit for detecting the electrical idle (squelch) is 10 ms.

(2) When the system is in electrical idle (i.e., power management state) at the time of surprise removal, the surprise removal may be observed by periodically (e.g., every 100 milliseconds) utilizing the remote receiver detection process, discussed in section "A" of this disclosure.

Once it is has been determined that chip B is decoupled from chip A, control circuitry 90 places transmitter TXA1 in a high impedance state. A reason why transmitter TXA1 is placed into a high impedance state is to avoid having a common mode of transmitter TXA1 be transferred to a remote receiver when it is coupled or if it is physically but not functional coupled. In the high impedance state, driver 42 is off and resistive structures 60 and 62 have high impedance. The discussions of FIGS. 4 and 6 explain ways in which the high impedance in the resistive structures may be achieved. Other ways may be used. In high impedance state, either V1 or V2 may be applied to nodes 48 and 50 when the attachment of AP1 and AP3 and AP2 and AP4 occurs. Nodes 48 (D+) equal node 50 (D−) (electrical idle).

The same process also may apply for the transmitters of chip B realizing, but this discussion is from the perspective of chip A.

High and low impedance (resistance) levels are not limited to particular values. However, low impedance may be chosen to match the interconnect (transmission line) impedance. High impedance should be at least 10 times low impedance. More practically, high impedance would be 100 or more times the low impedance. For example, if low impedance were 50 ohms, high impedance may be 5K to 20K ohms. (Note that the terms resistance and impedance are used interchangeably in this disclosure).

2. Coupling

In many cases, it is desirable that a system be flexible enough to support different common modes between transmitters and receivers. For example, it is sometimes desirable for a system to support a situation in the common mode of the transmitters of chip A is large enough so that if it were applied to the input receivers of chip B, it would harm them.

Consider a transition from FIG. 2 to FIG. 3. In FIG. 2, chips A and B are physically decoupled and chip A realizes it. Transmitter TXA1 is in a high impedance state. Chips A and B then become functionally coupled as in FIG. 3. TXA1 remains in a high impedance state. TXA1 charges nodes 48 and 50 to a common mode voltage (e.g., V1). TXA1 loops into a detection process such as the remote receiver detection state mentioned above. Once a remote receiver is detected, TXA1 goes into a low impedance mode and proceeds with trying to communicate with the receiver (e.g., training and configuration).

Examples of and an appreciation of the benefits of the high impedance state are provided as follows. Assume that attachment points AP1–AP4 are separated as shown in FIG. 2. Further assume, driver 42 is inactive and resistive structures 60 and 62 have a high impedance. Assume nodes 48 and 50 have the common mode voltage. Capacitors CAC1-1 and CAC2-1 leak the voltage from nodes 48 and 50 to the interconnects 30-1 and 32-1 near attachment points AP1 and AP2. Further, assume that the common mode voltage is high enough that if it were directly applied to the input transistors of receiving circuitry 44, they gate oxide of the input transistors would be damaged.

In FIG. 3, when attachments points AP1 and AP2 are first attached to AP3 and AP4, there is an instantaneous voltage divider between resistive structure 60 and 70 and a voltage divider between restive structure 62 and 72. The resistance for resistive structures 60, 62, 70, and 72 are R60, R62, R70, and R72, respectively. Assuming Vbias2 is at ground, the instantaneous voltage drop across resistive structure 70 is Vcommon mode R70/(R60+R70) and the instantaneous voltage drop across resistive structure 72 is Vcommon mode R72/(R62+R72). By making R60 and R62 much larger than R70 and R72, the instantaneous voltage on the interconnects very small. For example, if R60=5K ohms and R70=50 ohms, the instantaneous voltage on interconnect 30-1 is Vcommon mode 50/(50+5000)=0.01 Vcommon mode, which will not be great enough to damage the remote receivers.

Once it is established that RXB1 is coupled to TXA1, then TXA1 can return to a low impedance state and continue trying to communcate with the remote receiver.

Various features described herein, such one or more illustrated in the other figures may be used in the systems described in this section.

C. Test Equipment and Compliance Testing

1. Test Equipment

In some embodiments, testing may occur by coupling test equipment to transmitters, such as TXA1 in chip A. Once chip A detects the presence of the test equipment and does not get a response through local receivers of chip A, chip A triggers TXA1 (and perhaps other transmitters) to initiate a specialized compliance test pattern. The test pattern may be designed to create worst case voltage and timing margins. The test pattern may include, for example, both cross talk and inter symbol interference (ISI).

Different approaches may be used. In some approaches, if any of the local receivers of a chip sense an unexpected electrical idle input, all the transmitters of the chip (or some subset of them) begin transmitting the compliance test pattern. In other approaches, only those transmitters associated with a local receiver that senses an unexpected electrical idle input begins the compliance test pattern. Still other approaches may be used. If the local receivers begin to sense signals (as opposed to the unexpected electrical idle), the compliance state may stop.

Figure 13:
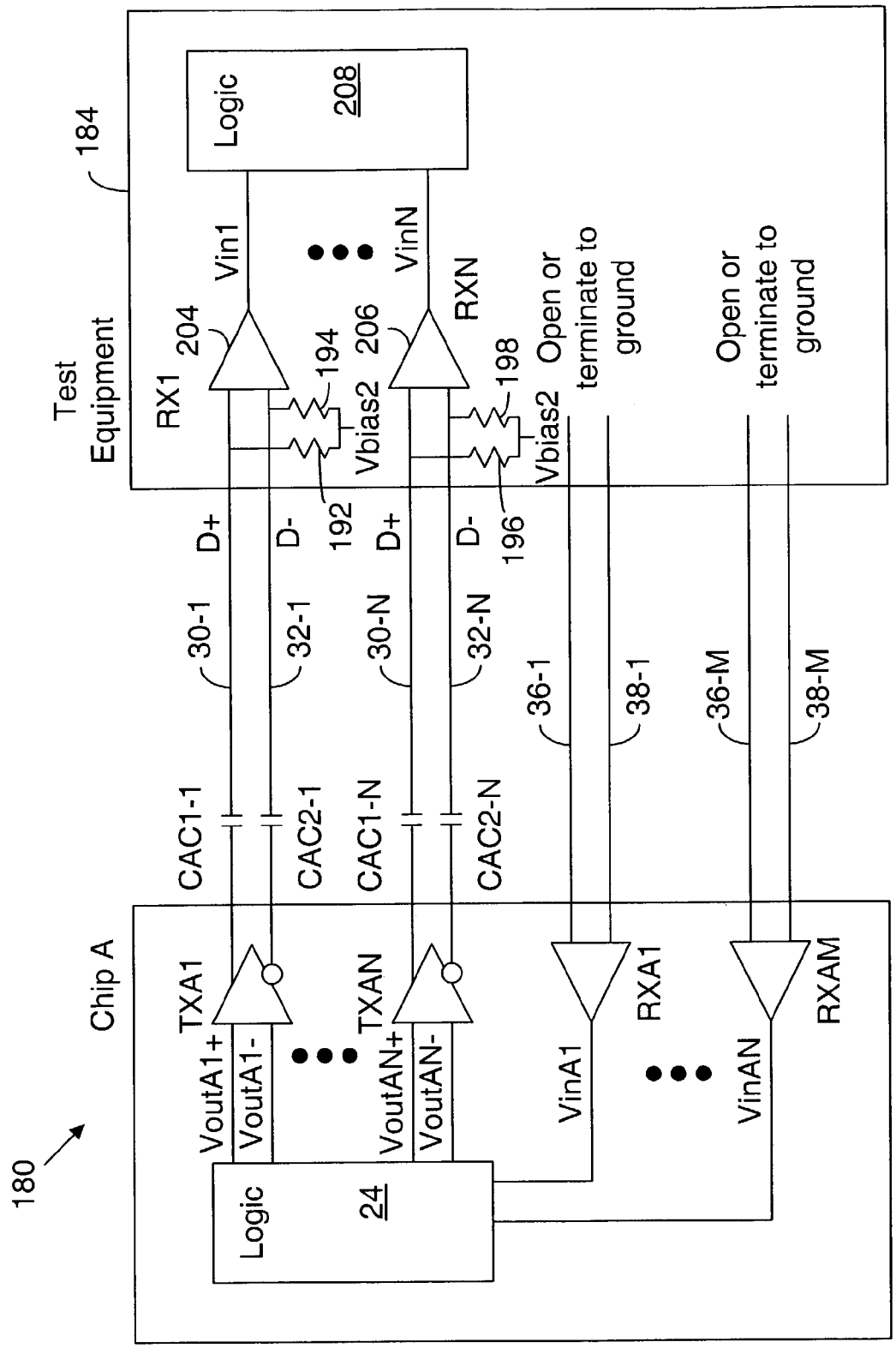
FIG. 13 is a schematic block diagram representation of a system including a chip and test equipment according to some embodiments of the inventions.

For example, referring to FIG. 13, a system 180 includes chip A and test equipment 184. Test equipment 184 may be an oscilloscope, a network analyzer, or other test equipment. In some embodiments, test equipment 184 is standard, off the shelf test equipment. In other embodiments, test equipment 184 is specially designed for use with compliance testing of chip A. Transmitters TXA1 . . . TXAN of chip A are coupled to receivers RX1 . . . RXN in test equipment 184 through interconnects 30-1, 32-1 . . . 30-N, 32-N. Note that the value of "N" may be, but does not have to be, the same in FIG. 13 as it is in FIG. 1. That is, there may be some transmitters in FIG. 1 (note shown in FIG. 13) that are not coupled to receivers in test equipment 184. Receiver RX1 includes receiving circuitry 204 and resistive structures 192 and 194 coupled between interconnects 30-1 and 32-1, respectively, and Vbias2, which may be at ground or another voltage. In response to VoutA1 . . . VoutAN signals, transmitters TXA1 . . . TXAN provide D+ and D− signals to receiver circuitry 204 . . . 206 which in turn provide Vin1 . . . VinN signals to logic 208.

Test equipment 184 does not have transmitters that transmit signals to receivers RXA1 . . . RXAM of chip A. However, some specialized test equipment may have transmitters that can transmit meaningful signals to local receivers RXA1 . . . RXAM that, for example, trigger the compliance test pattern. In the case of FIG. 13, interconnects 36-1, 38-1 . . . 36-M, 38-M are shown connecting to test equipment 184 and then being open or terminating to ground. Alternatively, they may be open or terminate to ground outside of test equipment 184 (see, for example, FIG. 15).

Transmitters TXA1 . . . TXAN go through a detect process (such as the remote receiver detection state described above or through another remote receiver detection technique) to determine that they are coupled to receivers. (Alternatively, fewer than all the transmitters may perform the detect process.) In this case, the remote receivers are in test equipment 184. TXA1 . . . TXAN can use the high impedance state described in section B of this disclosure until it is determined that the receivers are coupled to the transmitters. When it is determined that test equipment 184 is coupled to TXA1 . . . TXAN, transmitters TXA1 . . . TXAN proceed with trying to communciate with the chip of the remote receivers. However, when control circuitry 90 recognizes that none or some (depending on the approach) of receivers RXA1 . . . RXAM are receiving signals (called squelch), control circuitry 90 enters a compliance test state and provides VoutA1 . . . VoutAN signals accordingly. The local receivers sensing an unexpected electrical idle may be used as a way of recognizing that signals have not been received.

Figure 14:
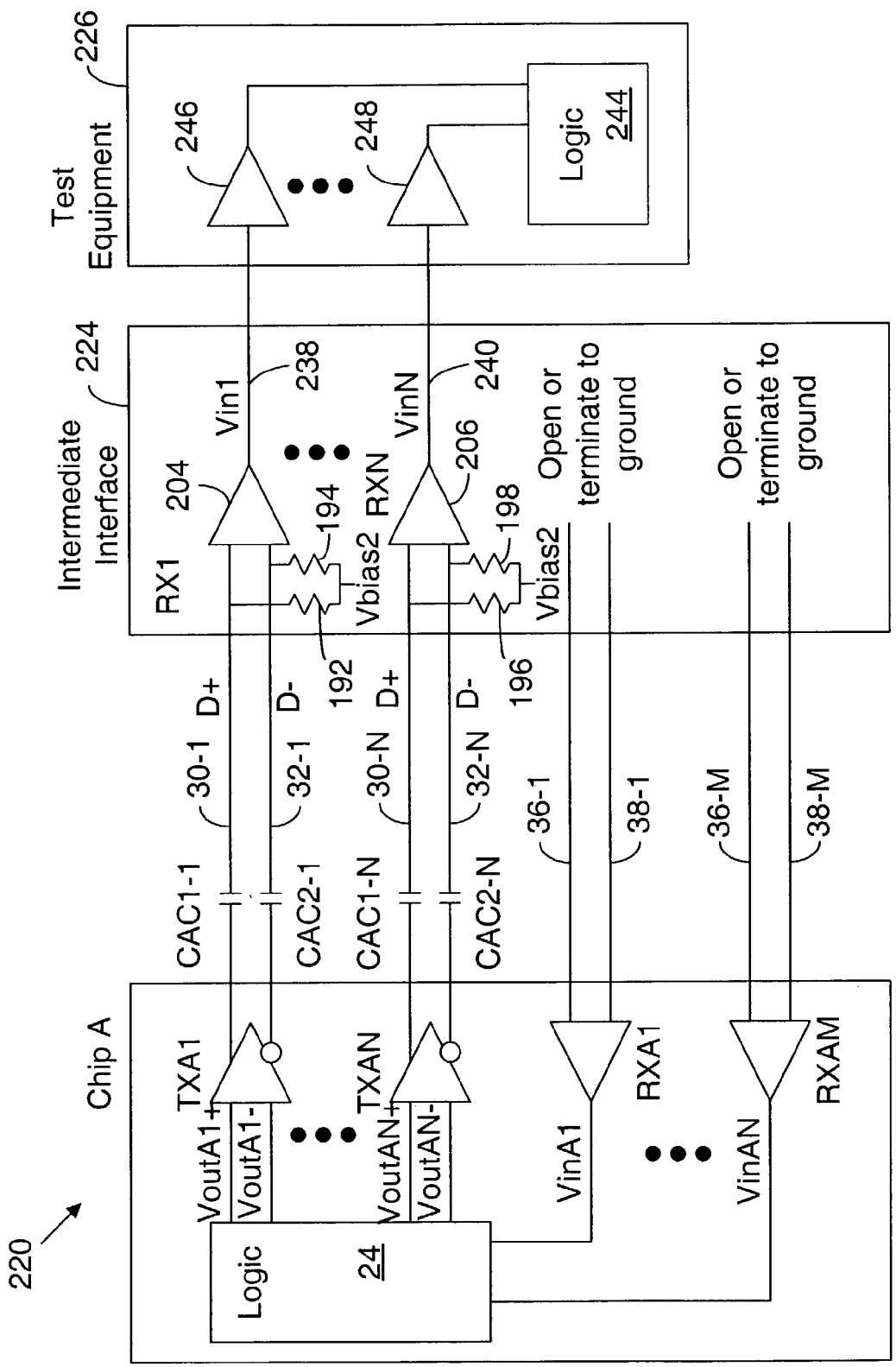
FIG. 14 is a schematic block diagram representation of a system including a chip, an intermediate interface, and test equipment according to some embodiments of the inventions.

FIG. 14 illustrates a system 220 which includes an intermediate interface 224 coupled between chip A and test equipment 226 (which may be the same as or different than test equipment 184). Intermediate interface 224 may be associated with probes. Intermediate interface 224 includes receivers RX1 . . . RXN, while test equipment 226 includes receivers 246 . . . 248. (Note that receivers 246 . . . 248 may also include terminations, but they are not shown.) Chip A detects the presence of loads 192, 194 . . . 196, 198 in intermediate interface 224, with the remote receiver detection state or another technique. Intermediate interface 224 provides single ended signals Vin1 . . . VinN on conductors 238 . . . 240 to receivers 246 . . . 248 of test equipment 226, which in turn provide signals to logic 244.

Figure 15:
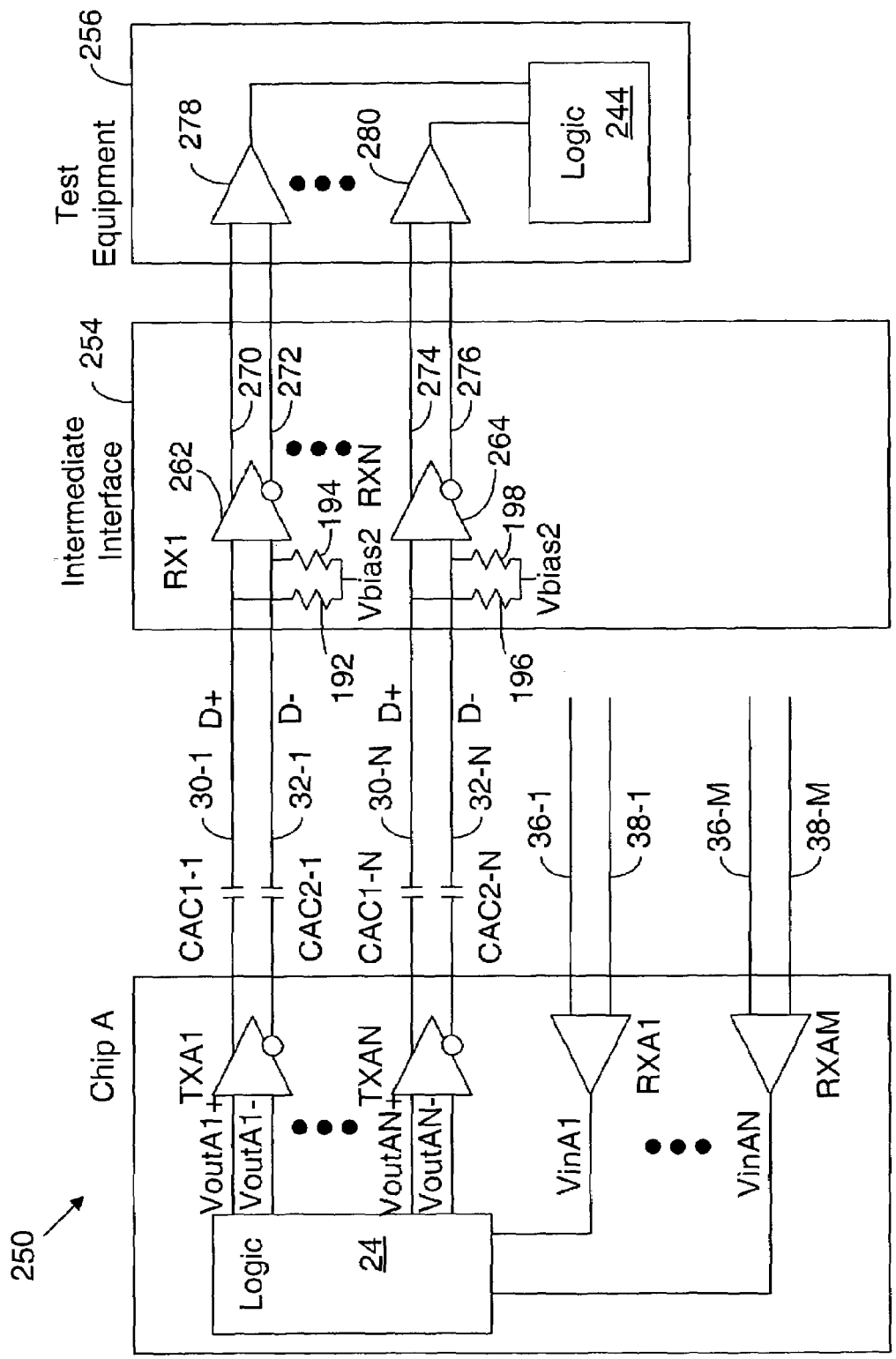
FIG. 15 is a schematic block diagram representation of a system including a chip, an intermediate interface, and test equipment according to some embodiments of the inventions.

FIG. 15 illustrates a system 250 which is similar to system 220 of FIG. 14 except that interconnects 270, 272 . . . 274, 276 carry received input signals differentially between intermediate interface 254 and receivers 278 . . . 280 of test equipment 256. Further, as an example, FIG. 15 illustrates the case in which interconnects 36-1, 38-1 . . . 36-M, 38-M are not connected to intermediate interface 254.

2. Compliance Testing

Various compliance test patterns may be used in compliance testing. The following describes a pattern involving the 8b/10b symbols K28.5, D21.5, K28.5, and D10.2 repeating. However, the inventions are not limited to using this pattern. Various other patterns may be used, including well known and not previously used patterns. In some embodiments, current running disparity must be set to negative before sending the first symbol.

Table 1 represents a compliance sequence that may be used in some embodiments of the inventions.

TABLE 1

| Symbol | K28.5 | D21.5 | K28.5 | D10.2 |
|---|---|---|---|---|
| Current Disparity | 0 | 1 | 1 | 0 |
| Pattern | 0011111010 | 1010101010 | 1100000101 | 0101010101 |

For any given chip that has multiple lanes, every eighth lane is delayed by a total of four symbols. A two symbol delay occurs at both the beginning and end of the four symbol sequence. A delay sequence on every eighth lane is shown in Table 2 in which D is a K28.5 symbol.

TABLE 2

| Lane | Symbol | Symbol | Symbol | Symbol | Symbol | Symbol | Symbol | Symbol |
|---|---|---|---|---|---|---|---|---|
| Every 8th | D | D | K28.5 | D21.5 | K28.5 | D10.2 | D | D |

After the 8 symbols are sent, the delay symbols are advanced to the next lane and the process is repeated as shown in Tables 3 and 4.

TABLE 3

| Lane | Symbol | Symbol | Symbol | Symbol | Symbol | Symbol | Symbol |
|---|---|---|---|---|---|---|---|
| Lane 0 | D | D | K28.5− | D21.5 | K28.5+ | D10.2 | continued in table 4 |
| Lane 1 | K28.5− | D21.5 | K28.5+ | D10.2 | K28.5− | D21.5 | continued in table 4 |
| Lane 2 | K28.5− | D21.5 | K28.5+ | D10.2 | K28.5− | D21.5 | continued in table 4 |
| Lane 3 | K28.5− | D21.5 | K28.5+ | D10.2 | K28.5− | D21.5 | continued in table 4 |
| Lane 4 | K28.5− | D21.5 | K28.5+ | D10.2 | K28.5− | D21.5 | continued in table 4 |
| Lane 5 | K28.5− | D21.5 | K28.5+ | D10.2 | K28.5− | D21.5 | continued in table 4 |
| Lane 6 | K28.5− | D21.5 | K28.5+ | D10.2 | K28.5− | D21.5 | continued in table 4 |
| Lane 7 | K28.5− | D21.5 | K28.5+ | D10.2 | K28.5− | D21.5 | continued in table 4 |
| Lane 8 | D | D | K28.5− | D21.5 | K28.5+ | D10.2 | continued in table 4 |
| Lane 9 | K28.5− | D21.5 | K28.5+ | D10.2 | K28.5− | D21.5 | continued in table 4 |

TABLE 4

| Lane | Symbol | Symbol | Symbol | Symbol | Symbol | Symbol | Symbol |
|---|---|---|---|---|---|---|---|
| Lane 0 | Con't from table 3 | D | D | K28.5− | D21.5 | K28.5+ | D10.2 |
| Lane 1 | Con't from table 3 | K28.5+ | D10.2 | D | D | K28.5− | D21.5 |
| Lane 2 | Con't from table 3 | K28.5+ | D10.2 | K28.5− | D21.5 | K28.5+ | D10.2 |
| Lane 3 | Con't from table 3 | K28.5+ | D10.2 | K28.5− | D21.5 | K28.5+ | D10.2 |
| Lane 4 | Con't from table 3 | K28.5+ | D10.2 | K28.5− | D21.5 | K28.5+ | D10.2 |
| Lane 5 | Con't from table 3 | K28.5+ | D10.2 | K28.5− | D21.5 | K28.5+ | D10.2 |
| Lane 6 | Con't from table 3 | K28.5+ | D10.2 | K28.5− | D21.5 | K28.5+ | D10.2 |
| Lane 7 | Con't from table 3 | K28.5+ | D10.2 | K28.5− | D21.5 | K28.5+ | D10.2 |
| Lane 8 | Con't from table 3 | D | D | K28.5− | D21.5 | K28.5+ | D10.2 |
| Lane 9 | Con't from table 3 | K28.5+ | D10.2 | D | D | K28.5− | D21.5 |

Note the following explanations:

K28.5− represents a comma when disparity is negative, specifically: "001111010"

K28.5+ represents a comma when disparity is positive, specifically: "1100000101"

D21.5 represents an out of phase data character, specifically: "1010101010"

K10.5 represents an out of phase data character, specifically: "0101010101"

D represents delay character K28.5

In some embodiments, this sequence of delays ensures that the maximum possible interference effects of adjacent lanes, enabling measurement of the compliance pattern under close to worst-case inter-symbol interference and cross-talk conditions. In some embodiments, the compliance pattern is only exited if the receivers begin to detect signals such that there is an exit from the electrical idle condition or if a physical reset occurs. In some embodiments, the compliance pattern is not entered if the receiver has previously detected an exit from electrical idle.

As noted, the compliance test pattern used may be slightly or significantly different than that described above.

Additional Information

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

The inventions are not restricted to the particular details listed herein. Indeed, those skilled in the art having the benefit of this disclosure will appreciate that many other variations from the foregoing description and drawings may be made within the scope of the present inventions. Accordingly, it is the following claims including any amendments thereto that define the scope of the inventions.

What is claimed is:

1. A chip comprising:
   transmitters;
   local receivers;
   nodes coupled to the transmitters and resistive structures coupled between the nodes and at least one variable voltage source, and change detection circuitry to detect changes in voltages of the nodes following a change in voltage of the at least one variable voltage sources, and to determine whether the changes in voltages in the nodes are consistent with the transmitters being coupled through interconnects to the remote receivers; and
   control circuitry to determine whether the transmitters are coupled to remote receivers in a remote chip through interconnects, wherein the control circuitry detects the coupling with the assistance of the change detection circuitry, and further wherein if the control circuitry determines that the transmitters are coupled to the remote receivers through the interconnects and that the local receivers do not receive a response signal from the remote chip within a first length of time immediately following the determination of coupling, then the control circuitry causes at least some of the transmitters to transmit a compliance test pattern.

2. The chip of claim 1, wherein the at least one variable voltage source each include first and second sub-voltage sources, and the resistive structures each include first and second sub-resistive structures coupled to the first and second sub-voltage sources, respectively, and wherein the change in voltage of the variable voltage source occurs through at least turning off some of the sub-resistive structures.

3. The chip of claim 1, further comprising a switch to controllably place the at least one variable voltage source at either a first or a second voltage, and the change in voltage of the variable voltage source occurs through the switch changing the variable voltage source from the first voltage to the second voltage.

4. The chip of claim 1, wherein the change detection circuitry measures how long it takes following the change in voltage of the variable voltage source for the voltages of nodes to reach a threshold voltage and compares the measured length of time with a threshold length of time.

5. The chip of claim 1, wherein the change detection circuitry measures the voltages of the nodes at a second length of time following the change in voltage of the variable voltage source and compares the measured voltages with a threshold voltage.

6. The chip of claim 1, wherein only one of the nodes is coupled to each transmitter.

7. The chip of claim 1, wherein two of the nodes are coupled to each transmitter.

8. The chip of claim 7, wherein the transmitters at times provide a signal differentially to the two nodes and at times provides the same voltage to the two nodes.

9. The chip of claim 1, wherein the interconnects are part of lanes and in compliance test pattern every eighth lane is delayed by a total of four symbols and a two symbol delay occurs at both the beginning and end of the four symbols.

10. A system comprising:
   interconnects; and
   a first chip including:
      transmitters;
      local receivers;
      nodes coupled to the transmitters and resistive structures coupled between the nodes and at least one variable voltage source, and change detection circuitry to detect changes in voltages of the nodes following a change in voltage of the at least one variable voltage sources, and to determine whether the changes in voltages in the nodes are consistent with the transmitters being coupled through interconnects to the remote receivers; and
      control circuitry to determine whether the transmitters are coupled to remote receivers in a remote chip through interconnects, wherein the control circuitry detects the coupling with the assistance of the change detection circuitry, and further wherein if the control circuitry determines that the transmitters are coupled to the remote receivers through the interconnects and that the local receivers sense an electrical idle input within a first length of time immediately following the determination of coupling, then the control circuitry causes at least some of the transmitters to transmit a compliance test pattern.

11. The system of claim 10, wherein the change detection circuitry measures how long it takes following the change in voltage of the variable voltage source for the voltages of nodes to reach a threshold voltage and compares the measured length of time with a threshold length of time.

12. The system of claim 10, wherein the change detection circuitry measures the voltages of the nodes at a second length of time following the change in voltage of the variable voltage source and compares the measured voltages with a threshold voltage.

13. The system of claim 10, wherein only one of the nodes is coupled to each transmitter.

14. The system of claim 10, wherein two of the nodes are coupled to each transmitter.

15. The system of claim 10, wherein the interconnects each include a series AC blocking capacitor.

16. The system of claim 10, wherein if the remote receivers are physically coupled to the transmitters, but the remote receivers do not have power, the control circuitry determines that the receivers are not coupled to the transmitters.

17. The system of claim 10, wherein the interconnects are part of lanes and in compliance test pattern every eighth lane is delayed by a total of four symbols and a two symbol delay occurs at both the beginning and end of the four symbols.

18. A system comprising:
   first and second interconnects; and
   a first chip including:
      a transmitter;
      a local receiver;
      first and second nodes coupled to the transmitter and first and second resistive structures coupled between the first and second nodes, respectively and a variable voltage source, and change detection circuitry to detect changes in voltages of the first and second nodes following a change in voltage of the variable voltage source, and to determine whether the changes in voltages in the first and second nodes are consistent with the transmitter being coupled through the first and second interconnects to the remote receivers; and
      control circuitry to determine whether the transmitters are coupled to remote receivers in a remote chip through first and second interconnects, wherein the control circuitry detects the coupling with the assistance of the change detection circuitry, and further wherein if the control circuitry determines that the transmitters are coupled to the remote receivers through the first and second interconnects and that the local receiver senses an electrical idle input within a first length of time following the determination of coupling, then the control circuitry causes at least some of the transmitters to transmit a compliance test pattern.

19. The system of claim 18, wherein the change detection circuitry measures how long it takes following the change in voltage of the variable voltage source for the voltages of first and second nodes to reach a threshold voltage and compares the measured length of time with a threshold length of time.

20. The system of claim 18, wherein the change detection circuitry measures the voltages of the first and second nodes at a second length of time following the change in voltage of the variable voltage source and compares the measured voltages with a threshold voltage.

21. A system comprising:
   a first interconnect; and
   a first chip including:
      a transmitter;
      a local receiver;
      a first node coupled to the transmitter and a first resistive structure coupled between the first node and a variable voltage source, and change detection cir cuitry to detect a change in voltage of the first node following a change in voltage of the variable voltage source, and to determine whether the change in voltage in the first node is consistent with the transmitter being coupled through the first interconnect to the remote receiver; and control circuitry to determine whether the transmitters are coupled to remote receivers in a remote chip through first interconnect, wherein the control circuitry detects the coupling with the assistance of the change detection circuitry, and further wherein if the control circuitry determines that the transmitters are coupled to the remote receivers through the first interconnect and that the local receivers do not receive a response signal from the remote chip within a first length of time following the determination of coupling, then the control circuitry causes at least some of the transmitters to transmit a compliance test pattern.

* * * * *